United States Patent [19]
Giguere et al.

[11] Patent Number: 5,834,971
[45] Date of Patent: Nov. 10, 1998

[54] RF AMPLIFIER INCLUDING TRAVELING WAVE TUBE WITH SEQUENTIAL STAGES

[75] Inventors: David B. Giguere, Palos Verdes Estates; Paul A. Gianfortune, Redondo Beach, both of Calif.

[73] Assignee: Hughes Electronics, Los Angeles, Calif.

[21] Appl. No.: 554,651

[22] Filed: Nov. 8, 1995

[51] Int. Cl.$^6$ .................................................. H03F 3/58
[52] U.S. Cl. .............................................. 330/43; 315/3.6
[58] Field of Search ........................... 315/3.5, 3.6, 39.3; 330/43, 149, 151

[56] References Cited

U.S. PATENT DOCUMENTS

| | | | |
|---|---|---|---|
| 4,912,367 | 3/1990 | Schumacher et al. | 315/3.5 |
| 5,162,697 | 11/1992 | Davis et al. | 315/3.6 |
| 5,162,747 | 11/1992 | Tammaru | 330/44 |
| 5,402,085 | 3/1995 | Cole | 330/149 |

OTHER PUBLICATIONS

Walchli, Pamela L. et al.; "Traveling–Wave Tubes"; Electronic Engineers'Handbook; 3rd Edition; 1989; pp. 9–45 to 9.–51.

Mendel, J. T.; "Magnetic Focusing of Electron Beams"; Proc. IRE; vol. 43; 1995; pp. 327–331.

Seidel, H.; "A Microwave Feed–Forward Experiment"; The Bell System Technical Journal; vol. 50; No. 9; Nov. 1971; pp. 2879–2916.

Rowe, J. E.; Nonlinear Electron–Wave Interaction Phenomena; New York; Academic Press; 1965; pp. 177–262 and 550–569.

Rosen, H. A. et al.; "Power Amplifier Linearity Studies for SSB Transmissions"; IEEE Transactions on Communications Systems; Jun. 1965; pp. 150–159.

Rizzi, Peter A.; Microwave Engineering, Prentice Hall, Inc.; 1968; pp. 299.410.

*Primary Examiner*—Steven Mottola
*Attorney, Agent, or Firm*—Elizabeth E. Leitereg; Terje Gudmestad; Wanda K. Denson-Low

[57] ABSTRACT

Multiple gain stages are provided in a single traveling wave tube amplifier (TWTA). Each gain stage comprises an interaction circuit, an associated RF input, and an associated RF output. The gain stages are separated by a drift length that is selected to achieve a desired interaction between gain stages. In one embodiment that uses only one TWT, couplers, and adjustment blocks external to the TWT, feed-forward and feedback connections remove intermodulation distortion introduced by the TWTA.

21 Claims, 3 Drawing Sheets

RF AMPLIFIER INCLUDING TRAVELING WAVE TUBE WITH SEQUENTIAL STAGES

BACKGROUND OF THE INVENTION

1. Field of the Invention

This invention relates to radio frequency (RF) amplifiers, and more particularly to the amplification of multicarrier RF signals.

2. Description of the Related Art

Multi-carrier RF signals find application in a wide variety of environments: satellite earth terminals, satellite transponders, and cellular telephone base stations, to name a few.

Within one cell, an assigned geographic area, of a cellular telephone system, an active subscriber is assigned a channel which, at the RF signal level, corresponds to one or more carrier frequencies. Within each cell is a cellular base station which, upon receiving information from the land-based telephone network, modulates the corresponding carriers, amplifies the resulting RF signals, and combines them in preparation for broadcasting the resultant multicarrier RF signal to subscribers within the cell.

Amplification of multi-carrier signals can generate inter-modulation distortion (IMD) which degrades the signal to noise ratio of the information signal. IMD must therefore be minimized, either by avoiding its generation or by post-amplification reduction.

Carrier frequencies, or tones, and the spacing between them are often modified for the purposes of channel management. Increasingly, cellular systems employ packet data switching techniques to transmit data during unmodulated cell-phone time slots. Additionally, channel frequency allocations are unevenly spaced. For these reasons, any base station amplification system must, ideally, accommodate frequent modification of the carrier frequencies and uneven channel spacing ("frequency agile" operation). Efficiency is important in any amplifier application to avoid unnecessary power losses. But, because base stations are unmanned, autonomous units that often rely upon battery/solar array combinations for primary power, power efficiency is not just important, it is critical.

One approach to amplifying multi-carrier signals in the cellular environment is to assign a separate solid state amplifier to each channel, then quadrature combine the outputs of these amplifiers. As a base station receives information for a particular channel, it employs this information to modulate the corresponding carrier frequency and then routes the modulated signal, first to a narrow-band filter, and then to a solid-state amplifier. The outputs of the amplifiers, perhaps twenty, are then quadrature-combined and sent to the base station transmitter.

Unfortunately, although this approach provides acceptable inter-modulation performance, it does so at the expense of efficiency and frequency-agility. Not only are numerous amplifiers, combiners, and adjustment mechanisms required, systems of this type typically exhibit low efficiency (power out vs. power in). Furthermore, because a trained technician must adjust complex electromechanical systems in order to modify channel carrier frequencies, these systems do not provide the autonomous, frequency agile performance increasingly demanded of cellular base station amplifier systems.

Frequency-agile operation may be attained using a wide-band amplifier such as a traveling wave tube (TWT) amplifier but, as is well-known in the art, the non-linearity of a TWT amplifier creates undesirable IMD products when amplifying a multi-carrier RF signal at close to saturation, where the TWT efficiency is best. Traveling wave tube amplifiers are described in J. Swegle et al, . *Phys. Fluids*, 28(9), September 1985, pages 2882–2894, W. W. Destler et al., "Microwave and Particle Beam Sources and Propagation", SPIE, Vol. 873, (1988), pages 84–91, and J. R. Pierce, *Traveling Wave Tubes,* D. Van Nostrand Company, Inc. 1950. Conventional IMD reduction techniques would require additional TWTs and, therefore, would create greatly reduced operating efficiency.

For the forgoing reasons, there is a need for a high-efficiency, low distortion, frequency-agile, multicarrier amplifier.

SUMMARY OF THE INVENTION

The present invention is directed to low-distortion, high efficiency amplification of multi-carrier RF signals with a traveling wave tube amplifier that also achieves frequency-agile operation.

A traveling wave tube amplifier of the present invention, in one of its simplest embodiments, comprises an electron beam source, two sequentially situated interaction structures, a drift space separating the interaction structures and an input port and output port for each of the interaction structures, and a collector to gather the spent beam.

The inventive arrangement, basically, that of a multi-stage traveling wave tube amplifier with an input port and an output port for each stage sharing the same beam, allows one to employ feed-forward and/or feedback techniques to reduce the IMD products which are produced during amplification.

In a further embodiment, the invention comprises the above-mentioned multi-stage TWT amplifier, couplers, phase and amplitude adjusters and delay lines configured to amplify a multi-carrier signal and provide feed-forward and feedback for distortion reduction.

A multi-carrier signal is split at a divider, with a portion of the signal delivered to the second stage of a two stage TWT amplifier and the remainder fed forward to a divider/combiner for carrier cancellation. After amplification, a portion of the amplified signal in the second stage of the TWT is combined in the coupled arm of the divider/combiner with the fed forward portion of the original signal. The multi-carrier components of the combined signals are equal in amplitude but 180 degrees out of phase, causing the multi-carrier components to cancel and yield a low power version of the IMD products at one output of the divider/combiner. The through arm of the divider/combiner contains the bulk of the amplified multi-carrier signal. The low power version of the IMD products is fed both back and forward to the first stage of the TWT amplifier, which reduces the IMD products in two ways. Some of the reduction is achieved by velocity modulating the common electron beam for the two TWT stages with the signal fed back to the first stage so as to reduce IMD products in the second stage. Additionally, an RF output from the first stage, which consists of IMD products, is destructively combined with residual IMD products in the amplified multi-carrier signal. Velocity modulation of the common electron beam and destructive combination with an RF output from the first stage combine to substantially eliminate IMD products from the amplified multi-carrier signal.

Because the invention produces both amplification and correction using only one TWT, efficiency is greatly increased over that afforded by prior amplifiers.

Furthermore, because the TWT is a relatively wide-band device, the invention provides frequency-agile performance.

DETAILED DESCRIPTION OF THE INVENTION

Figure 1:
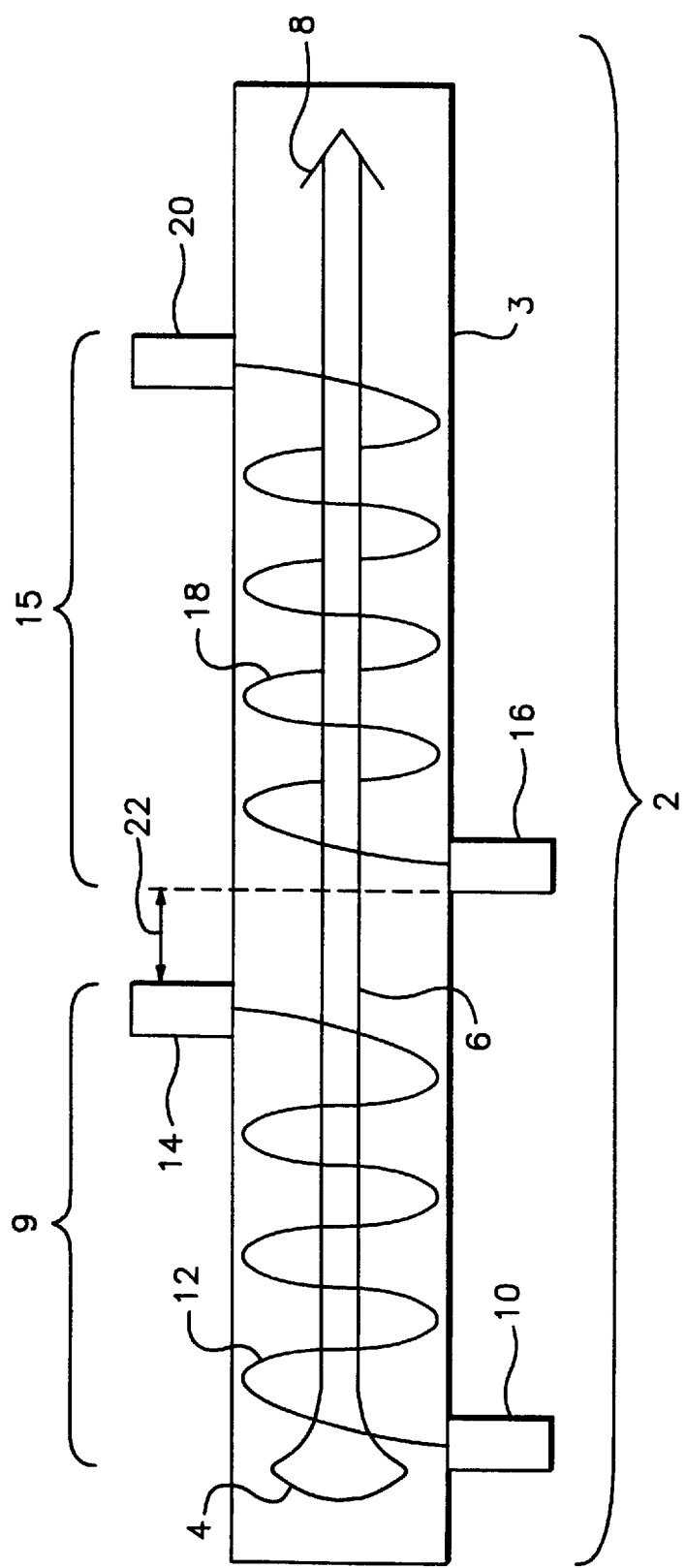
FIG. 1 is a simplified sectional view of a two-stage TWT employed in one embodiment of the invention.

One embodiment of the invention is shown in FIG. 1. This aspect of the invention comprises a TWT 2 that includes a cylindrical waveguide housing 3, an electron source 4 which emits an electron beam 6, a beam collector 8, and a correction stage 9 which includes an interaction structure 12, a first RF input port 10, and a first RF output port 14. The TWT also includes a power stage 15 which comprises a second RF input port 16, a second interaction structure 18 and a second RF output port 20. The first RF output port 14 and the second RF input port 16 are separated by a drift length 22.

In operation, the electron source 4 emits electrons which are accelerated toward the collector 8 along the housing 3. The accelerated electrons can be formed into and maintained as a beam 6 by magnetic or electrostatic fields (not shown) surrounding the housing 3 (see, for example, "Traveling-Wave Tubes", Pamela L. Walchli and Allan Scott, *Electronic Engineers' Handbook*, Third Edition, pages 9.45–9.51 1989 and J. T. Mendel, "Magnetic Focusing of Electron Beams", *Proc. IRE,* Vol. 43, pp 327–331, 1995). Alternatively, the electron gun may be implemented as described in U.S. Pat. No. 4,912,367 to Schumacher et al. and assigned to Hughes Aircraft Company, the assignee of the present invention. This type of electron gun injects an electron-beam of sufficiently high current density into a waveguide to at least partially ionize the gas within the waveguide. The waveguide gas pressure is kept at a level, preferably within the approximate range of $1$-to-$5 \times 10^{-5}$ Torr, that is sufficiently low to avoid voltage breakdown in the electron-gun, but high enough to allow sufficient ionization to substantially neutralize space-charge blowup of the electron-beam. By thus restricting the diameter of the electron-beam, the use of externally applied magnetic fields that must ordinarily be maintained around the beam to limit its expansion is avoided.

An RF signal is introduced into the correction stage's 9 RF input port 10 and travels along the interaction structure 12. Interaction structures per se are well known and may comprise any of a variety of circuit structures, including helices suspended within the waveguide 3 or a periodically varying inner wall radius of the waveguide 3 itself. Either structure may be accompanied by an attenuator ion mechanism that serves to isolate the RF energy coupled in the input of structure to the output of the circuit structure. The RF signal introduced at the RF input port 10 interacts with the electron beam 6 as it travels along the interaction structure 12. More particularly, the RF field velocity-modulates the electrons as they travel along the core of the housing 3 towards the collector 8. The velocity modulated electron beam 6, in turn, increases the strength of the RF signal traveling along the interaction structure 12 and the strengthened RF signal increases the velocity modulation, and so on. In this regenerative fashion the RF signal is amplified as it travels along the interaction structure 12. The amplified RF signal is then available at the RF output port 14. Although the RF output port 14 is illustrated on the opposite side of the housing 3 from the RF input port 10, this arrangement is merely for the convenience of illustration. The RF input ports 10 and 16 could just as easily be located on the same side of the housing 3 as RF output ports 14 and 20.

Similarly, an RF signal introduced at the power stage's 15 RF input port 16 interacts with the electron beam 6 as it travels along the interaction structure 18, and an amplified RF signal is available at the RF output port 20. Note, however, that because the same electron beam passes through both interaction structures 12 and 18, the RF output at output port 20 is an amplified combination of the RF signals introduced at the two RF input ports 10 and 16. By adjusting the drift length 22, signals introduced at the RF input ports 10 and 16 may be combined constructively or destructively. Thus, the illustrated TWT acts as a multi-stage amplifier.

Adjustment of the drift length 22 may entail an iterative design process. That is, a drift length 22 is determined based on the wavelength of the signals being amplified, and the type of interaction desired. An integral number of wavelengths will lead to constructive combination of signals of like frequency; an additional half wavelength will lead to destructive combination. In practice, a calculated drift length 22, may not lead to optimal performance. One may then modify the TWT design to shorten or lengthen the drift length 22, as required, and build a new TWT having the desired drift length 22. Alternatively, one may adjust the drift length 22, for example, by adjusting the separation of the interaction structures within the TWT.

The availability of multiple input and output ports, each associated with a distinct interaction structure, permits the use of various feed-forward and feedback techniques that have been developed for other applications. (A discussion of feed-forward techniques is available from H. Seidel, "A Microwave Feed-Forward Experiment", *The Bell System Technical Journal,* Vol. 50, No. 9, November, 1971, pages 2879–2916.) However, because the invention employs only one TWT, rather than the multiplicity of TWTs that would conventionally be employed to effect feedforward and feedback IMD reduction, operational efficiency is greatly enhanced. This is so because a great deal of the input power in TWT operation is devoted to creating and accelerating the TWT electron beam. To achieve acceptable IMD performance, TWT amplifiers are typically operated backed off 6 dB from saturation and, consequently, a substantial portion of the input power is dissipated as heat. (See, J. E. Rowe, *Nonlinear Electron-Wave interaction Phenomena,* New York, Academic Press, 1965 and H. A. Rosen and A. T. Owens, "Power Amplifier Linearity Studies for SSB Transmissions", *IEEE Transactions on Communications Systems,* June 1965, pages 150–159. The authors note, "Traveling-wave tube amplifiers, as well as most other types, are characterized by an increase in linearity and a corresponding reduction in IMD distortion as the ratio of the average power output to peak power capability is reduced. Thus, any linearity specification can be met by sufficiently increasing the peak power capability of the amplifier. This brute force approach results in requirements for impractically high power levels when commercial IM standards are to be met." Configured properly, the embodiment of FIG. 1 substantially improves the operating efficiency of a TWT amplifier by eliminating additional TWTs with their associated increased power requirements.

Figure 2:
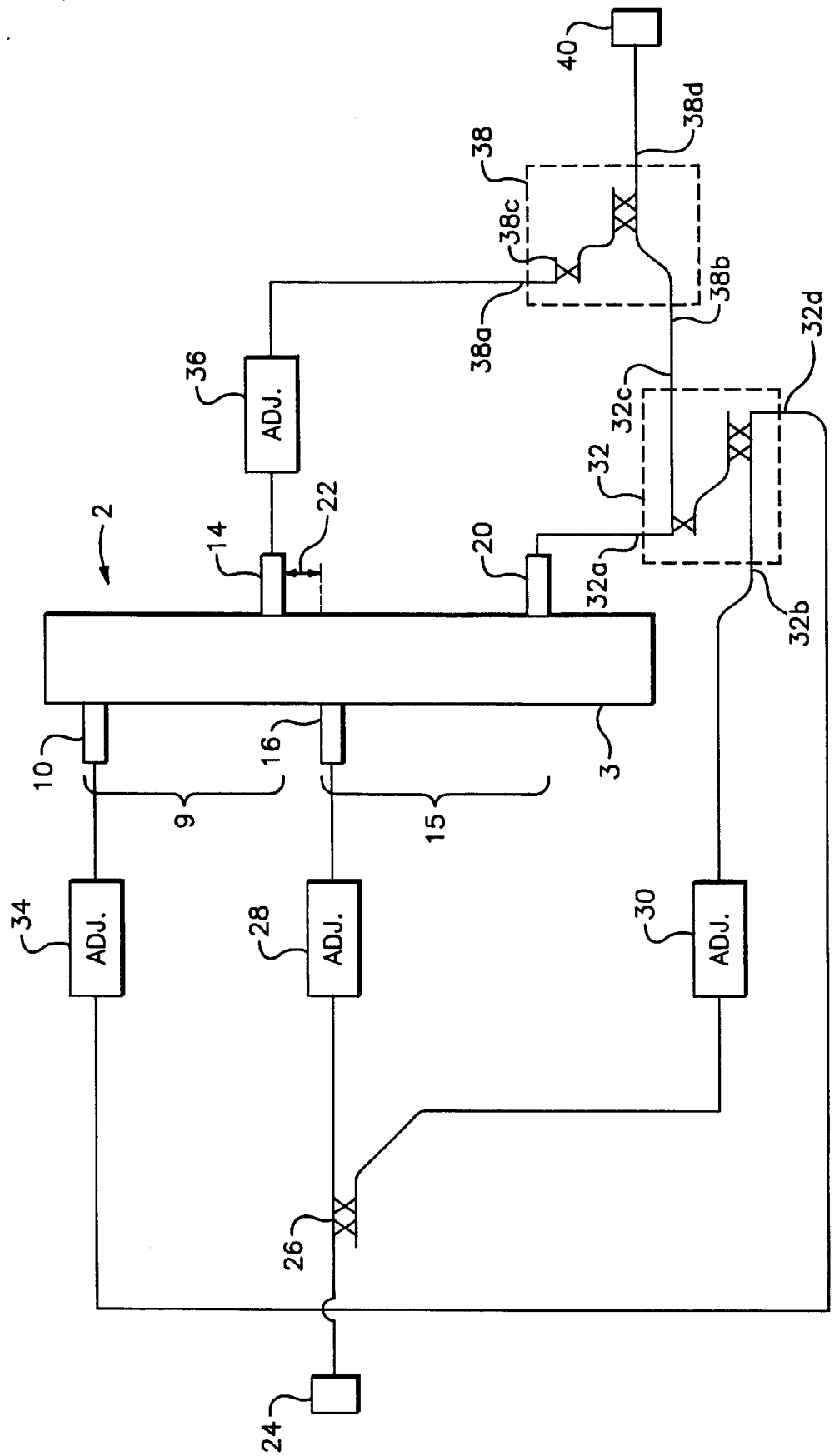
FIG. 2 is block diagram of a complete amplification system based upon the TWT shown in FIG. 1.

To illustrate in greater detail the advantages of the invention, FIG. 2 shows a more complete amplification system that is based upon the amplifier of FIG. 1. A multi-carrier RF signal is introduced to the amplifier system at an RF input 24. The signal is divided by an RF divider 26 and portions of the input signal are transmitted to adjustment blocks 28 and 30. The majority of the input power is transmitted to the adjustment block 28 for eventual amplification by the second interaction structure 18 of the TWT 2.

The RF power dividers and combiners employed by the invention are passive RF components that are well known in the art. They are commonly used in coaxial (lower frequency), strip-line (medium frequency), and waveguide (high frequency) applications. These components are widely available "off the shelf" from manufacturers such as Hewlett Packard Corporation, Palo Alto, Calif.

In particular, power dividers are available in 3 dB, 4 dB, 10 dB, 20 dB and many more denominations. A divider is commonly a three or four port device with an input, a "through" arm, and a "coupled" arm. Power transmitted to the input is split between the through arm and the coupled arm. The ratio of power in the through arm to that in the coupled arm of a 3 dB coupler would be $^-$log (3/10)=2/1, that for a 6 dB coupler would be $^-$log (6/10)=4/1, for a 10 dB coupler it would be $^-$log (10/10)=10/1, etc.. Coaxial dividers are typically implemented as a tee junction, with the ratio of power in the output arms of the tee (when match terminated) given by $P_1/P_2 = (Z_2/Z_1)^2$, where $Z_1$ and $Z_2$ are the respective impedances of the two output arms. Waveguide dividers are typically bifurcated waveguides, with the ratio of power between the coupled and through arms given by $P_1/P_2 = Z_1/Z_2$, where $Z_1$ and $Z_2$ are the respective impedances of the coupled and through arms. Dividers are commonly used in applications such as sampling a signal to monitor power levels.

Combiners are available in many different implementations. Common waveguide combiners include the shunt, or H-plane, tee and hybrid- or magic- tee. The H-plane tee is a three port device with one port designated the H port and the other two ports the coplaner ports. The sum of two signals introduced to the coplaner ports will be available at the H port. Similarly, the sum of two signals introduced to the coplaner ports of a hybrid tee is available at the H port (the hybrid tee has an additional port, commonly designated the E port).

Dividers and combiners that impart various phase shifts to signals are also available. Further, dividers and combiners are often used in combination and referred to as divider/combiners. One may, for example, employ a divider to sample a signal, then combine that sample in a combiner with another signal. For a more complete discussion of dividers, combiners, attenuators and phase shifters, see Peter A. Rizzi, Microwave Engineering, Prentice Hall, Inc., 1988, pages 299–411.

The output from adjustment block 30 is fed forward directly to one input 32b of a signal divider/combiner 32, while the output from adjustment block 28 is transmitted through the TWT's second interaction structure 18, via input port 16 and output port 20, to a second input 32a of divider/combiner 32. The signal at the divider/combiner input 32a includes any IMD that the TWT may have added to the original RF input, while the signal at the divider/combiner input 32b is free of any such IMD since it has bypassed the TWT. The signal at input 32a is divided, with the majority of the signal transmitted to the through arm 32c and the remainder of the signal fed into the coupled arm where it is combined with the fed forward signal on input 32b. The latter signal is, due to adjustment blocks 28 and 30 and the power ratio of the divider portion of the divider/combiner 32, 180 degrees out of phase with and scaled equal to the signal on the coupled arm of divider/ combiner 32. The combined signals are therefore subtracted from each other, producing an output on the combiner output branch 32d that is substantially an IMD signal which varies with the amount of IMD on the amplified signal. This IMD signal is fed back to the input port 10 of the correction stage 9 through an adjustment block 34, and also fed forward in the sense that the input RF signal at terminal 24 enters the second stage 15 before the signal on combiner output 32d is applied to the correction stage 9.

The adjustment block 34 and first interaction structure 12 produce a net amplification of the IMD signal that is manifested in two ways: velocity modulation of the electron beam 6 and production of an amplified RF IMD signal at the output 14. The level of net amplification from the adjustment block 34 and correction stage 9 is chosen so that the IMD components introduced to the power stage 15 by velocity modulation of the electron beam 6 are equal in amplitude, after amplification by the power stage 15, to IMD products that would normally be present at the output of the power stage 15 if no correction stage 9 were used. By selecting the drift length 22 so that the amplified correction stage IMD signal is 180 degrees out of phase with the input RF signal at port 16, the superimposed negative correction stage IMD signal effectively cancels the positive buildup of IMD along the power stage 15, yielding an RF output from port 20 that has a much lower IMD level than would otherwise be the case.

In addition to the negative feedback loop just described, a further reduction in IMD is achieved by feeding forward the RF IMD output from the correction stage's output port 14 through another adjustment block 36 to one input 38a of another signal divider/combiner 38. The signal is divided (for level adjustment) and the signal in the coupled arm is routed to a combiner input (one of the coplaner ports in a hybrid implementation). The input to the other divider/combiner input 38b (the other coplaner port in a hybrid implementation) comes from the through output 32c of the divider/combiner 32. This signal is scaled equal to, and 180 degrees out of phase with, the signal on input 38a, due to adjustment blocks 34 and 36. Therefore, the IMD signal on input 38a cancels the residual IMD component of the signal on input 38b, producing a net output (from the H port in a hybrid implementation) at the RF output port 40 that contains the amplified multi-carrier signal with residual IMD components further reduced.

Figure 3:
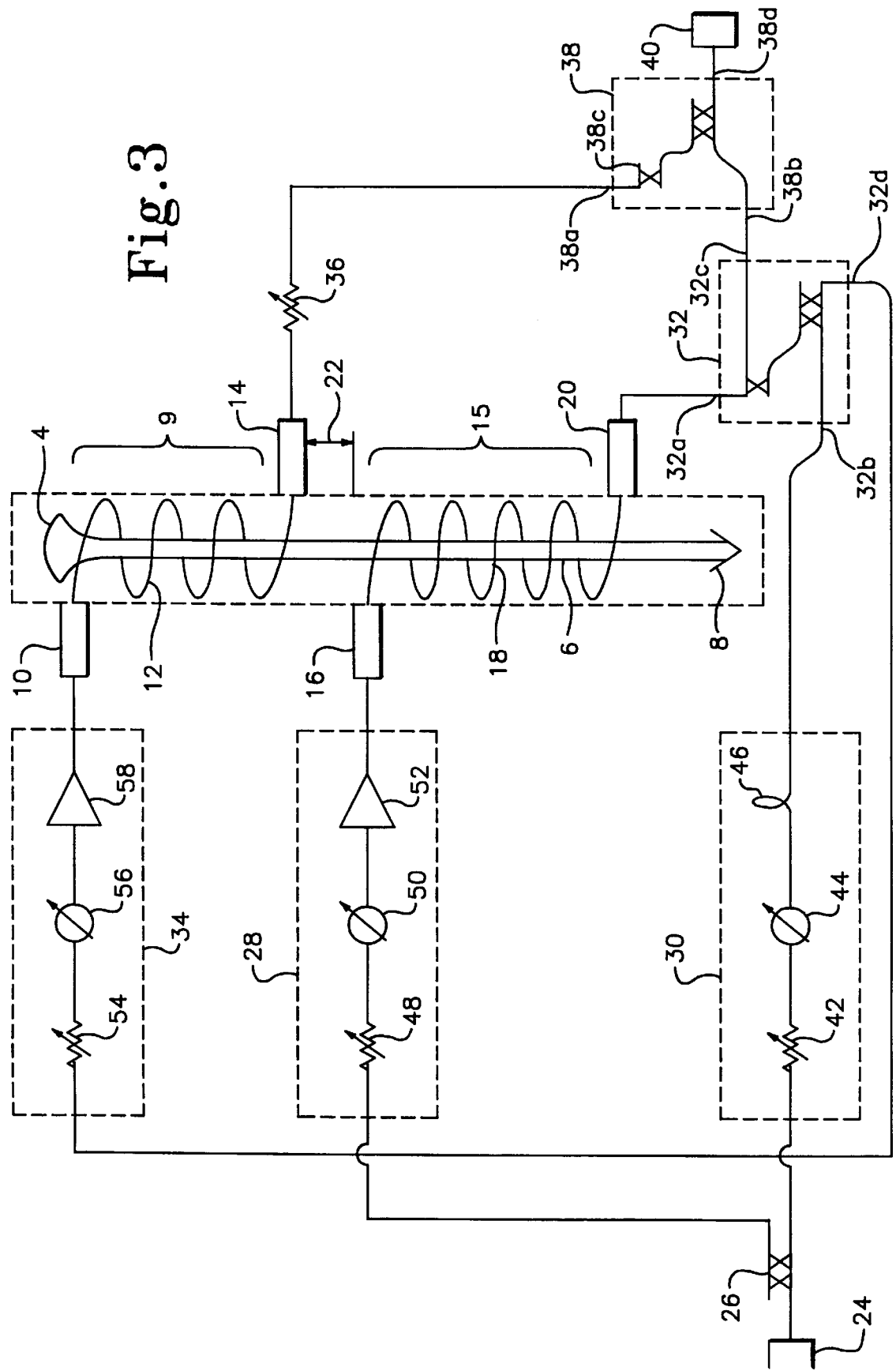
FIG. 3 is a more detailed schematic diagram of the embodiment of FIG. 2.

FIG. 3 sets forth, in greater detail, the embodiment of FIG. 2. In particular, the adjustment block 30 comprises a variable attenuator 42, a variable phase shifter 44 and a variable delay 46 connected in series. The adjustment block 28 comprises a variable attenuator 48, a variable phase shifter 50 and a gain block 52 that are also connected in series. Similarly, the adjustment block 34 comprises a variable attenuator 54, a variable phase shifter 56 and a gain block 58 connected in series. The various attenuators, phase shifters, gain blocks and delay lines are well known in the art, and their adjustment will be discussed in greater detail below.

Suppose, as a design example, that multi-carrier signals at 10 dBm must be amplified to 43 dBm. Assume that, because it would produce unacceptable IMD products if driven at saturation, the power stage 15 is operated, at approximately 6 dB "backed off" in power from saturation. At this level of operation, the IMD products are determined by the following relation:

$$C/CTB = 2(P_3 - P_0) - 6 - (10 \text{ LOG } 3N^2 - 10W + 8)/8$$

Where:

C/CTB is the level of IMD products below the carriers.

$P_3$ is the third order intercept point of the power stage.

$P_0$ is the power per channel.

N is the total number of channels

In a cellular base station application that requires twenty channels at twenty Watts (43 dBm) each, operating the second stage 15 at a power level 6 dB backed off from saturation (20 channels×20 Watts=400 Watts=56 dBm, therefore 62 dBm power level) yields IMD products that are 17 dB down from the carriers at the output of the power stage 15.

To implement this design, assume that the gain of the power stage 15 is 15 dB. To completely cancel the IMD products, an IMD signal inverted in phase and at a level of 43−17−15=11 dBm would be required at the input of the power stage 15. If we further assume that the coupled arm of the divider/combiner 32 is 52 dB down from the input 32a, the input to the adjustment block 34 is 26 dBm−52 dB=−26 dB. If the attenuator 54 imparts an additional 9 dB drop, the IMD products will be at −35 dBm at the input of the gain block 58. The combined gain of the gain block 58 and correction stage 9 should therefore be 46 dB to effect proper cancellation. That is, −35 dBm+46 dB yields the desired 11 dBm IMD products at the input to the power stage 15. In this case, the correction stage could be set at 26 dB gain, and the gain block 58 at 20 dB gain.

As noted above, the drift length 22 (the separation between the correction stage 9 and the power stage 15) must be designed and adjusted so that the output from the correction stage 9 is 180 degrees out of phase with the input of the lower stage 15 at the point where the input signal is launched on the electron beam, and should therefore be approximately the IMD signal wavelength multiplied by the sum of an integral number plus one-half.

The adjustment block 36 is adjusted to provide the proper level for feed-forward cancellation at the divider/combiner 38. If the cancellation from the direct action of the correction stage 9 (i.e. feedback effected by velocity modulation of the electron beam in conjunction with a 180 degree phase shift provided by the drift length) is 25 dB, then, at the RF output port 20, the IMD product's magnitude should be 43−17−25=1 dBm. This means the IMD products have not been completely canceled by the correction stage 9 and residual IMD products at the level of 1 dBm are present in the signal at the power stage output port 20. If, additionally, the divider of the divider/combiner 38 is a 6 dB coupler, the adjustment block 36 should be adjusted according to:

11 dBm (the output of the correction stage 9) −6 dB (the divider/combiner 38) −1 dBm (the level of the IMD products) =4 dB.

Alternatively, if the divider of the divider/combiner 38 were a 10 dB coupler, the adjustment block 36 could be set to a unity amplification.

Assuming an input signal level of 10 dBm at the RF input 24 and that the coupled arm of the divider 26 is 8 dB down from the its input, the attenuator 42 must impart 11 dB of attenuation to provide a multi-carrier signal at a level of −9 dBm at the input 32b. This level will match that of the amplified carriers in the coupled arm of the divider/combiner 32 (43 dBm at the RF output 20 −52 dBm in the divider/combiner as assumed above). As noted above, the variable phase shifter 44 and the variable delay 46 are adjusted to align these signal 180 degrees out of phase with each other.

Because the carrier levels at the RF input port 16 must be 28 dBm (28 dBm+15 dB of gain assumed above for the power stage 15 yields the required 43 dBm carrier level at the output port 20), the combination of the attenuator 48 and the gain block 52 must provide 18 dB of gain. Furthermore, the attenuator 48 and phase shifter 50 must provide the proper gain and phase for stable operation of the TWT. Assuming 2 dB of attenuation in the attenuator 48 yields a requirement of 20 dB of gain for the gain block 52.

While an alternative illustrative embodiment of the invention has been shown and described, numerous variations and further alternate embodiments will occur to those skilled in the art. For example, more than two amplification stages could be employed with various feedforward/ feedback schemes, and phase shifts may be imparted by divider/combiners. Such variations and alternate embodiments are contemplated, and can be made without departing from the spirit and scope of the invention as defined in the appended claims.

We claim:

1. A radio frequency (RF) radiation amplifier, comprising:

an electron beam source, a tube positioned to receive, at a first end, an electron beam from the source and to collect the electron beam at a second end, a plurality of interaction structures distributed along the length of the tube, each successive interaction structure separated from the previous interaction structure by a drift length, a plurality of RF input ports distributed along the length of the tube for introducing RF radiation to respective interaction structures, and a plurality of RF output ports distributed along the length of the tube to extract RF radiation from respective interaction structures, wherein a first interaction structure with associated RF input and RF output ports is positioned closest to the electron beam source, and a second interaction structure with associated RF input and RF output ports is positioned further from the electron beam source than the first interaction structure and its associated RF ports, and wherein a portion of the output signal from the second interaction structure is introduced to the input port of the first interaction structure.

2. The amplifier of claim 1, wherein said drift length produce destructive interference between a signal introduced into the second interaction structure from the first interaction structure, and an RF signal introduced into the second interaction structure through its associated inlet port.

3. A traveling wave tube radio frequency (RF) radiation amplifier, comprising:

a waveguide having an electron beam source, a plurality of interaction structures disposed along the length of the waveguide in the path of a beam from said source, and respective pairs of RF input and output ports, associated with each of said interaction structures, wherein a portion of the output RF radiation from one interaction structure provides input RF radiation to another interaction structure.

4. The RF amplifier of claim 3, wherein the traveling wave tube comprises first and second amplifier stages, each of which comprises an interaction structure, an input port and an output port, with the first amplifier stage comprising a correction stage that is located nearest the traveling wave tube electron beam source.

5. The RF amplifier of claim 4, further comprising:

an RF divider connected to accept input RF radiation and having first and second outputs which are routed respectively to first and second signal adjusters, the output of the first signal adjuster being routed to the input of the second amplifier stage, the output of the second signal adjuster being routed to a first input of a first divider/combiner, the output of the second amplifier stage being routed to a second input of the first divider/combiner, a first output of the first divider/combiner being routed to a third signal adjuster, the output of the third adjuster being routed to the input of the first amplifier stage, the output of the first amplifier stage being routed to a first input of a second divider/combiner, a second output of the first divider/combiner being routed to a second input of the second divider/combiner, and a first output of the second divider/combiner comprising the amplifier output signal.

6. The RF amplifier of claim 5, wherein said correction and second stages are separated by a drift space whose length produces destructive interference between the electron beam introduced into the second stage from the correction stage, and an RF input to the second stage from the first signal adjuster.

7. The RF amplifier of claim 5, wherein the first and second signal adjusters adjust the amplitude and phase of the second amplifier stage output and a portion of the input signal, such that desired output signals are obtained at the outputs of the first divider/combiner.

8. The RF amplifier of claim 7, wherein the third signal adjuster adjusts the amplitude and phase of the signal input to the first amplifier stage such that desired output signals are obtained at the output of the second divider/combiner.

9. The RF amplifier of claim 8, wherein the third signal adjuster further adjusts the amplitude and phase of the input signal to the first amplifier stage such that the input signal produces a desired velocity modulation of the traveling wave tube electron beam.

10. The RF amplifier of claim 9 wherein the interaction structures comprise helices situated around the electron beam.

11. An RF amplifier, comprising:

a two-stage traveling wave tube having a power stage and a correction stage with respective interaction structures, inlet ports and outlet ports, said power stage being modulated by said correction stage and amplifying and imposing intermodulation distortion (IMD) on a signal introduced into its inlet port, a signal divider connected to provide one portion of an input RF signal as an input to the power stage and a second portion of the RF signal as a feed forward signal, a first signal coupler connected to produce an error signal that represents the difference in IMD between said feed forward signal and the power stage's output, a feedback circuit providing said error signal as an input to said correction stage, said correction stage amplifying said error signal to the scale of the RF input to said power stage and modulating the power stage to at least partially compensate for its IMD.

12. The RF amplifier of claim 11, further comprising a drift length separating the power and correction stages to produce destructive interference between said amplified error signal entering the power stage from said correction stage and an RF input signal to the power stage.

13. The RF amplifier of claim 11, further comprising respective power adjusters for said feed forward and power stage input signals to give said signals equal power scalings.

14. The RF amplifier of claim 13, further comprising a phase adjuster for at least-one of said feed forward and power stage input signals to place said signals 180 degrees out of phase with each other at said, first signal coupler, said first signal coupler-combining said signals to cancel their common RF input components.

15. The RF amplifier of claim 14, wherein said first signal coupler is a divider/combiner.

16. The RF amplifier of claim 14, wherein said phase adjuster is a series combination of a variable phase adjuster and an electrical delay.

17. The RF amplifier of claim 11, said first signal coupler producing a through output that approximates its input from said power stage, further comprising a second signal coupler, connected to receive said through output as a first input, and a feed forward circuit providing an amplified error signal from said correction stage's output port on the scale of said through output as a second input to said second signal coupler, said second signal coupler correcting said through signal with said amplified error signal to produce an RF amplifier output with a lower IMD level than said through signal.

18. The RF amplifier of claim 17, further comprising a power adjuster for at least one of said error and amplified error signals to give said amplified error signal and said through output signal equal scalings.

19. The RF amplifier of claim 18, further comprising a phase adjuster for at least one of said error and amplified error signals to place said signals 180 degrees out of phase with each other at said second signal coupler, said second signal coupler subtracting the IMD of said amplified error signal from its first input.

20. The RF amplifier of claim 18, wherein said power adjuster is a series combination of at least one variable attenuator and one adjustable gain block.

21. The RF amplifier of claim 17, wherein said second signal coupler is a divider/combiner.

* * * * *